US012238488B2

United States Patent
Schuster et al.

(10) Patent No.: US 12,238,488 B2
(45) Date of Patent: *Feb. 25, 2025

(54) SYSTEMS AND METHODS FOR EQUALIZING AUDIO FOR PLAYBACK ON AN ELECTRONIC DEVICE

(71) Applicant: GOOGLE TECHNOLOGY HOLDINGS LLC, Mountain View, CA (US)

(72) Inventors: Adrian M. Schuster, West Olive, MI (US); Prabhu Annabathula, Gurnee, IL (US); Kevin J. Bastyr, Milwaukee, WI (US); Andrew K. Wells, Lindenhurst, IL (US); Wen Hao Zhang, Lake Villa, IL (US)

(73) Assignee: GOOGLE TECHNOLOGY HOLDINGS LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/206,021

(22) Filed: Jun. 5, 2023

(65) Prior Publication Data

US 2023/0328468 A1 Oct. 12, 2023

Related U.S. Application Data

(63) Continuation of application No. 16/299,050, filed on Mar. 11, 2019, now Pat. No. 11,706,577, which is a (Continued)

(51) Int. Cl.
*H04R 29/00* (2006.01)
*G06F 3/01* (2006.01)
(Continued)

(52) U.S. Cl.
CPC .......... *H04R 29/001* (2013.01); *G06F 3/011* (2013.01); *G06F 3/0304* (2013.01);
(Continued)

(58) Field of Classification Search
CPC ........ H04S 7/301; H04S 2420/01; H04S 7/30; H04S 2400/11; H04S 2420/03;
(Continued)

(56) References Cited

U.S. PATENT DOCUMENTS 6,411,271 B1    6/2002   Bang et al.
6,766,028 B1    7/2004   Dickens
(Continued)

FOREIGN PATENT DOCUMENTS

CN      1625304 A    6/2005
CN    101449594 A    6/2009
(Continued)

OTHER PUBLICATIONS

Communication from counterpart German Application No. 11 2015 003 822.1, dated Oct. 30, 2017, 2 pp.
(Continued)

*Primary Examiner* — Lun-See Lao
(74) *Attorney, Agent, or Firm* — MARSHALL, GERSTEIN & BORUN LLP

(57) ABSTRACT

Embodiments are provided for receiving a request to output audio at a first speaker and a second speaker of an electronic device, determining that the electronic device is oriented in a portrait orientation or a landscape orientation, identifying, based on the determined orientation, a first equalization setting for the first speaker and a second equalization setting for the second speaker, providing, for output at the first speaker, a first audio signal with the first equalization setting, and providing, for output at the second speaker, a second audio signal with the second equalization setting.

17 Claims, 12 Drawing Sheets

Related U.S. Application Data continuation of application No. 15/818,444, filed on Nov. 20, 2017, now Pat. No. 10,405,113, which is a continuation of application No. 15/341,798, filed on Nov. 2, 2016, now Pat. No. 9,854,374, which is a continuation of application No. 14/464,789, filed on Aug. 21, 2014, now Pat. No. 9,521,497.

(51) Int. Cl.
| | | |
|---|---|---|
| G06F 3/03 | (2006.01) | |
| G06F 3/0346 | (2013.01) | |
| G06F 3/16 | (2006.01) | |
| H03G 5/16 | (2006.01) | |
| H04R 3/04 | (2006.01) | |

(52) U.S. Cl.
CPC .............. *G06F 3/0346* (2013.01); *G06F 3/16* (2013.01); *G06F 3/165* (2013.01); *H03G 5/165* (2013.01); *H04R 3/04* (2013.01); *G06F 2203/04108* (2013.01)

(58) Field of Classification Search
CPC ...... H04S 7/307; H04S 2400/01; H04S 7/305; H04S 7/303; H04S 2400/03; H04S 7/304; H04S 5/005; H04S 3/008; H04S 2400/13; H04S 2400/15; H04S 2420/07; H04S 1/005; H04S 3/00; H04S 1/007; H04S 3/02; H04R 2205/021; H04R 3/005; H04R 2227/005; H04R 2460/13; H04R 1/02; H04R 1/023; H04R 1/1008; H04R 1/1016; H04R 1/105; H04R 1/1075; H04R 1/1083; H04R 1/1091; H04R 2201/028; H04R 2420/01; H04R 2420/09; H04R 5/033; H04R 1/025; H04R 1/288; H04R 1/345; H04R 2201/107; H04R 2201/401; H04R 29/00; H04R 29/007; H04R 3/00; H04R 1/1058; H04R 1/1066; H04R 1/26; H04R 1/323; H04R 1/40; H04R 1/42; H04R 2201/023; H04R 2201/403; H04R 2227/007
USPC .......................... 381/56–58, 103–17; 700/94
See application file for complete search history.

(56) References Cited

U.S. PATENT DOCUMENTS

| | | | |
|---|---|---|---|
| 6,999,826 B1 | 2/2006 | Zhou et al. | |
| 8,375,137 B2 | 2/2013 | Bowman | |
| 8,768,494 B1 | 7/2014 | Stroud et al. | |
| 8,774,955 B2 | 7/2014 | Chen | |
| 8,879,761 B2 | 11/2014 | Johnson | |
| 8,971,554 B2 | 3/2015 | van Halteren | |
| 9,521,497 B2 | 12/2016 | Schuster et al. | |
| 9,854,374 B2 | 12/2017 | Schuster | |
| 10,129,675 B2 | 11/2018 | Bush | |
| 10,405,113 B2 | 9/2019 | Schuster et al. | |
| 11,706,577 B2* | 7/2023 | Schuster | H03G 5/165 381/59 |
| 2007/0110693 A1 | 5/2007 | Patt | |
| 2007/0223736 A1* | 9/2007 | Stenmark | H03G 5/005 381/103 |
| 2008/0146890 A1 | 6/2008 | LeBoeuf et al. | |
| 2008/0214160 A1 | 9/2008 | Jonsson | |
| 2009/0027338 A1* | 1/2009 | Weinberg | G10H 1/0083 345/157 |
| 2009/0067664 A1 | 3/2009 | Lim | |
| 2009/0110218 A1 | 4/2009 | Swain | |
| 2010/0040245 A1 | 2/2010 | Buil | |
| 2011/0081032 A1 | 4/2011 | Soulodre | |
| 2012/0051567 A1 | 3/2012 | Castor-Perry | |
| 2012/0194416 A1 | 8/2012 | Baba | |
| 2012/0314354 A1 | 12/2012 | Rayner | |
| 2013/0129122 A1* | 5/2013 | Johnson | H04S 1/00 381/306 |
| 2013/0188807 A1 | 7/2013 | Slotte | |
| 2013/0279706 A1* | 10/2013 | Marti | G06F 1/1688 381/57 |
| 2014/0003626 A1* | 1/2014 | Holman | H04S 7/307 381/103 |
| 2014/0046464 A1 | 2/2014 | Reimann | |
| 2014/0113551 A1 | 4/2014 | Krishnan et al. | |
| 2014/0140558 A1 | 5/2014 | Kwong | |
| 2014/0226837 A1 | 8/2014 | Grokop | |
| 2014/0233772 A1* | 8/2014 | Giustina | H04R 5/04 381/306 |
| 2014/0277646 A1 | 9/2014 | Anderson et al. | |
| 2014/0341399 A1 | 11/2014 | Dusse et al. | |
| 2015/0023533 A1 | 1/2015 | Johnson et al. | |
| 2015/0194995 A1 | 7/2015 | Fathollahi | |
| 2015/0223002 A1 | 8/2015 | Mehta et al. | |
| 2015/0245157 A1 | 8/2015 | Seefeldt | |
| 2015/0378522 A1 | 12/2015 | Butts | |
| 2016/0057555 A1 | 2/2016 | Schuster et al. | |
| 2017/0105070 A1 | 4/2017 | O'Polka | |
| 2017/0195790 A1 | 7/2017 | Choisel et al. | |
| 2017/0242653 A1 | 8/2017 | Lang et al. | |
| 2017/0330566 A1 | 11/2017 | Trott et al. | |
| 2017/0332168 A1 | 11/2017 | Moghimi et al. | |
| 2020/0074615 A1 | 3/2020 | Nabavi et al. | |
| 2020/0295795 A1 | 9/2020 | Fathollahi | |

FOREIGN PATENT DOCUMENTS

| | | |
|---|---|---|
| CN | 101467429 A | 6/2009 |
| CN | 101611617 A | 12/2009 |
| WO | WO-2007/110693 A1 | 10/2007 |
| WO | WO-2008/104843 A1 | 9/2008 |
| WO | WO-2014/063755 A1 | 5/2014 |
| WO | WO-2016/028962 A1 | 2/2016 |

OTHER PUBLICATIONS

Examination Report for Application No. GB1621545.1, dated Jan. 12, 2021.
International Preliminary Report on Patentability from International Application No. PCT/US2015/046009, dated Mar. 2, 2017, 9 pp.
International Search Report and Written Opinion for Application No. PCT/US2015/046009, dated Oct. 23, 2015.
Notification of First Office Action for Chinese Application No. 201580035579.8, dated Sep. 25, 2018.
Prosecution History from U.S. Appl. No. 14/464,789, dated Nov. 4, 2015 through Aug. 4, 2016, 49 pp.
Prosecution History from U.S. Appl. No. 15/341,798, dated Feb. 27, 2017 through Aug. 16, 2017, 24 pp.
Search Report for Application No. GB2106545.3, dated May 28, 2021.
Notification of First Office Action for Chinese Application No. 201910316866.6, dated Jan. 19, 2022.
Notification of Second Office Action for Chinese Application No. 201910316866.6, dated Jun. 29, 2022.
Notification of First Office Action for Chinese Application No. 201910853087.X, dated Nov. 3, 2022.

* cited by examiner

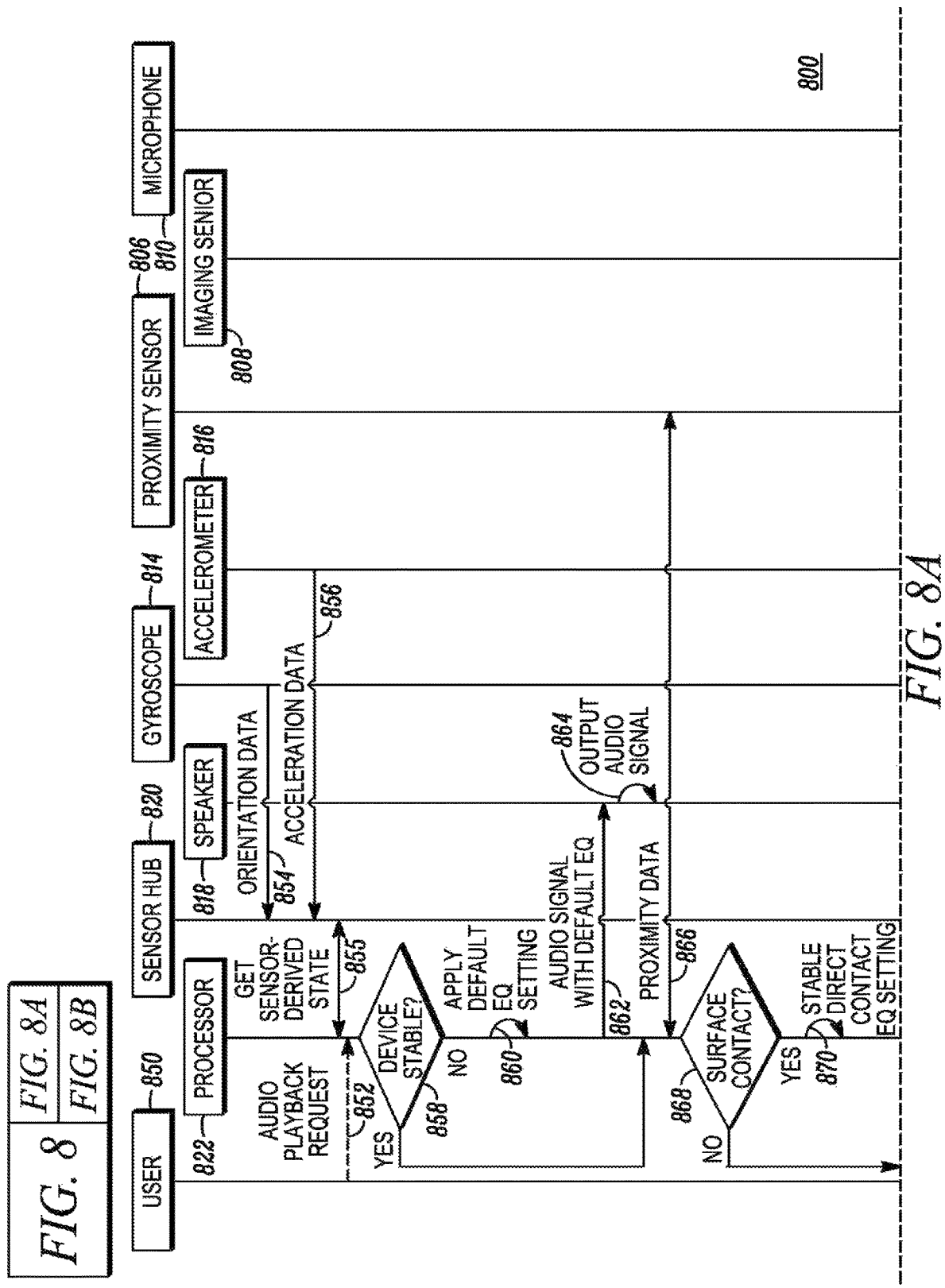

SYSTEMS AND METHODS FOR EQUALIZING AUDIO FOR PLAYBACK ON AN ELECTRONIC DEVICE

CROSS-REFERENCE TO RELATED APPLICATIONS

This application is a continuation of U.S. application Ser. No. 16/299,050, filed Mar. 11, 2019, which is a continuation of U.S. application Ser. No. 15/818,444, filed Nov. 20, 2017, issued as U.S. Pat. No. 10,405,113 on Sep. 3, 2019, which is a continuation of U.S. application Ser. No. 15/341,798, filed Nov. 2, 2016, issued as U.S. Pat. No. 9,854,374 on Dec. 26, 2017, which is a continuation of U.S. application Ser. No. 14/464,789, filed Aug. 21, 2014, issued as U.S. Pat. No. 9,521,497 on Dec. 13, 2016, all of which are hereby incorporated by reference in their entireties.

TECHNICAL FIELD

This application generally relates to improving audio playback on electronic devices. In particular, the application relates to platforms and techniques for applying equalization settings to audio data to be output by an electronic device based on a position or orientation of an active speaker of the electronic device relative to a surface.

BACKGROUND

Electronic devices such as smart phones support various channels and components for audio playback. For example, a user of an electronic device may participate in a telephone call by listening via an "earpiece" or "speakerphone" speaker of the electronic device. Further, the electronic device may output music via one or more built-in speakers. Additionally, the user may leverage an external speaker connected to the electronic device for added or enhanced audio playback.

There are various existing techniques to process audio data that is output via the speaker components of the electronic devices. In some existing devices, processing logic modifies the incoming signal to a speaker via various audio signal processing techniques based on volume settings, frequency response feedback, pressure feedback, or impedance feedback. In other devices, the orientation of peripheral headphones connected to the device is used to map sound signals that are provided to the headphones.

There is an opportunity to use data from one or more sensors of an electronic device to process audio data that is to be output by the electronic device.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed embodiments, and explain various principles and advantages of those embodiments.

FIGS. 8A and 8B depict a signal diagram associated with retrieving sensor data and processing audio data associated with an electronic device, in accordance with some embodiments.

DETAILED DESCRIPTION

Figure 1:
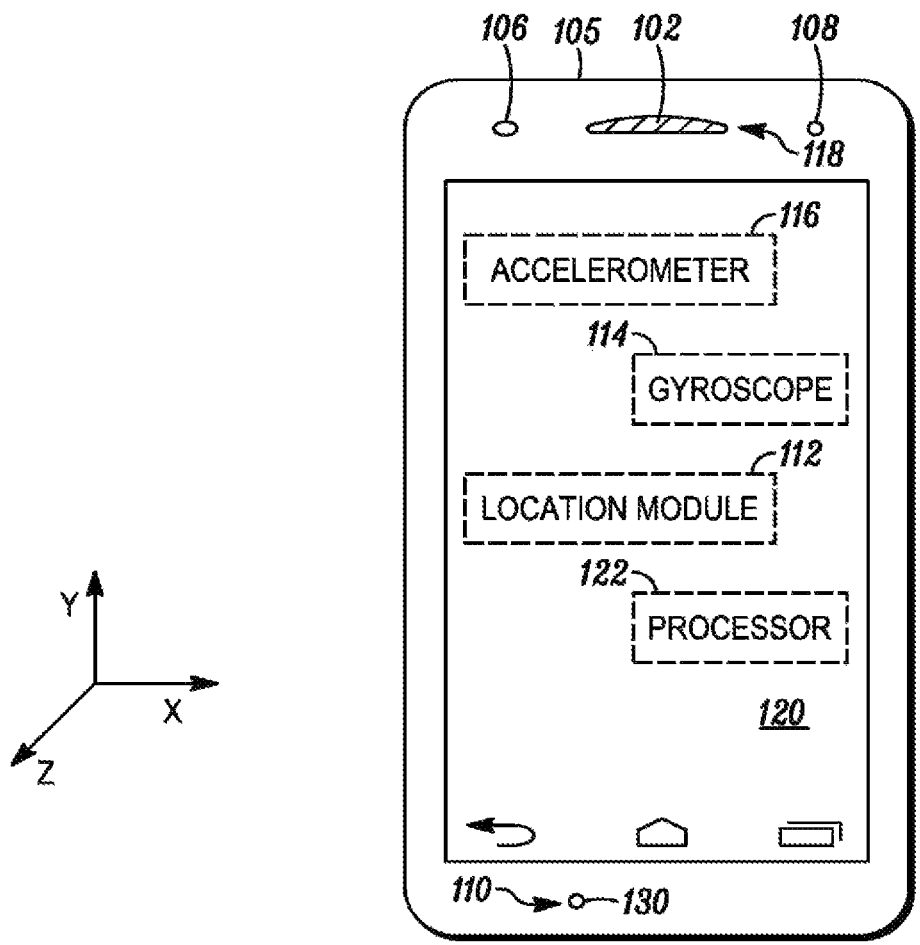
FIGS. 1 and 2 depict example electronic devices capable of facilitating selection and modification of audio equalization settings, in accordance with some embodiments.

Audio equalization is a technique used to alter the frequency and/or phase and/or time response of audio data, such as via the application of analog or digital filters. For example, filters may be applied to audio data to adjust the bass and treble tones present in outputted audio. Existing electronic devices support various applications that utilize speaker components to output audio, such as telephone applications, music applications, video conferencing applications, video players, social media applications, navigation applications, and others. Techniques to equalize the audio data that is output during operation of these various applications can lead to an improved user experience.

The embodiments described here process data from various built-in sensors of an electronic device to determine the general environment and orientation of the electronic device, and specifically an active speaker and speaker grille, relative to supporting or nearby surfaces and optionally to the listener. Generally, the orientation of the electronic device, including the orientation of the active speaker and its output grille, has an effect on the overall quality and sound of outputted audio. For example, if a built-in speaker grille of an electronic device is oriented flat against a surface, the audio output from a speaker may not have the intended bass tones, treble tones, resonance, and/or other audio characteristics. Typical electronic devices are equipped with various sensors whose data can indicate orientations and positions of the electronic devices. In particular, the sensors may include imaging sensors (e.g., cameras), proximity sensors, accelerometers, gyroscopes, location modules, ultrasonic sensors, infrared sensors, and others.

The electronic devices can store and adapt equalization settings that correspond to various local positions, orientations, or general environments for the electronic devices, whereby each of the equalization settings incorporates filters configured to improve or optimize the audio output for that particular local position of the electronic device relative to supporting surfaces and, in some cases, to the listener. For example, an electronic device may be stable and stationary with its built-in speaker grille(s) positioned flat (although possibly also recessed) against a surface. For further example, the electronic device may be stable and stationary with its built-in speaker(s) exposed but orientated away from a user. Further, for example, the electronic device may be stable but not stationary when it is traveling in a vehicle and secured in a dock or mount. Generally, an electronic device may be considered "stable" when there is little to no movement of the electronic device relative to a support surface(s). Further, an electronic device may be considered "stationary" when it is not moving. Accordingly, an electronic device may have absolute stability when (1) the electronic device itself is not moving (i.e., stationary) and (2) there is little to no movement of the electronic device relative to a surface(s); or relative stability when (1) the electronic device is moving (i.e., not stationary) and (2) there is little to no movement of the electronic device relative to a surface(s) (e.g., if the electronic device is mounted to a mount in a vehicle).

According to embodiments, the electronic device may collect data from various sensors and analyze the data to determine the local position of the electronic device. Further, the electronic device may identify a stored equalization setting that corresponds to the determined local position of the electronic device. In some optional embodiments, the electronic device may modify the equalization setting based on various factors such as acoustic input data (e.g., audio data generated by a microphone), optical data (e.g., data indicating whether a user is facing the speaker), infrared data, ultrasonic data, or other data. The electronic device may then apply the modified or unmodified equalization setting to the audio data, and output the equalized audio data via one or more speakers. In some cases, different speakers may have different equalization settings. The embodiments as discussed herein offer a benefit to users of the electronic devices by providing an improved audio playback experience. This benefit is especially important as electronic devices become more advanced and more incorporated into everyday use.

FIG. 1 depicts a front view of an example electronic device 105 configured to facilitate audio equalization processing and audio output. The electronic device 105 may be any type of portable electronic device, for example, a notebook computer, a mobile phone, a Personal Digital Assistant (PDA), a smart phone, a tablet computer, a multimedia player, an MP3 or MP4 player, a digital or analog broadcast receiver, a remote controller, or any other electronic apparatus. It should be appreciated that the front side of the electronic device 105 can be of various shapes and sizes. For example, the front side of the electronic device 105 can be flat, curved, angled, flexible, or the like.

The electronic device 105 can include audio components such as a speaker 118 with a grille 102, and a microphone 110 with an aperture 130. The speaker 118 is configured to output audio based on an electrical audio signal and the microphone 110 is configured to convert detected sound into an electrical signal. As illustrated in FIG. 1, the speaker 118 is an "earpiece" speaker that is commonly utilized by a user during telephone calls or similar applications. It should be appreciated that the types, sizes, and locations of the speaker 118, the speaker grille 102, the microphone 110, and the microphone aperture 130 are merely examples and that other types, sizes, and locations are envisioned.

The electronic device 105 can further include various sensors configured to detect proximate objects, listeners, orientations, positions, locations, and other general environment data associated with the electronic device 105. The position, orientation, and range of these sensors are fixed relative to a position and orientation of an active speaker of the electronic device 105. In particular, the electronic device 105 can include a proximity sensor 106 (e.g., capacitive, inductive, infrared, etc.) that is configured to detect the presence of nearby objects or objects in contact with the electronic device 105, and generate resulting proximity data. This proximity data may also reflect information regarding nearby objects relative to the speaker or speaker grille of the electronic device 105. The electronic device 105 can further include an imaging sensor 108 configured to capture optical images and generate resulting optical data (e.g., digital images). The optical data may also reflect information regarding objects relative to the speaker or speaker grille of the electronic device 105. It should be appreciated that various locations, types, sizes, and multiples of the proximity sensor 106 and the imaging sensor 108 are envisioned. Although not depicted in FIG. 1, it should be appreciated that the electronic device 105 may further include one or more ultrasonic sensors and/or one or more infrared sensors.

Additionally, the electronic device 105 can include an accelerometer 116 configured to measure an acceleration, or general orientation or movement of the electronic device 105 and generate resulting acceleration data, as well as a gyroscope 114 configured to measure an orientation or position of the electronic device 105 and generate resulting orientation data. For example, the gyroscope 114 may be a three-axis gyroscope configured to measure the pitch, roll, and yaw of the electronic device 106. Further, the accelerometer 116 may be a three-axis accelerometer that together with the three-axis gyroscope collectively provides six-axis capability. The electronic device 105 can additionally include a location module 112 that is configured to detect a location of the electronic device 105. For example, the location module 112 may include a Global Positioning System (GPS) module. Note that Cartesian axes X-Y-Z are anchored to the electronic device 105 rather than the environment.

Figure 2:
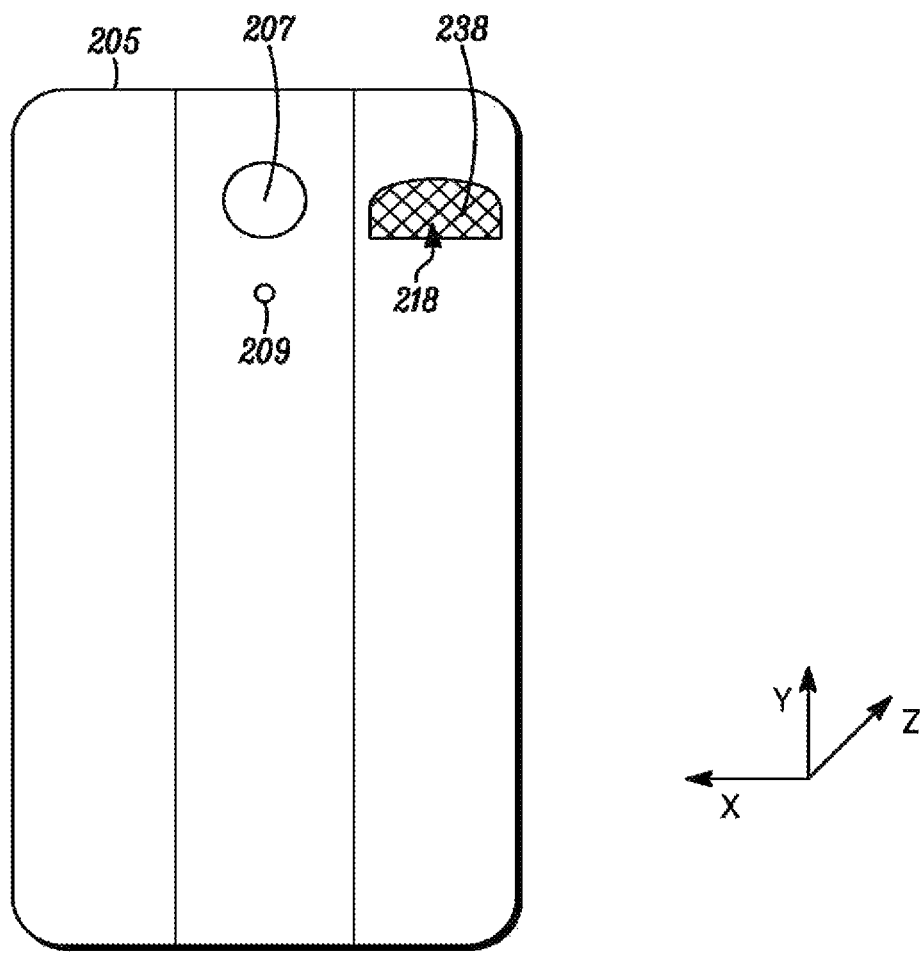

Turning now to FIG. 2. FIG. 2 illustrates a back view of an example electronic device 205 (such as a back view of the electronic device 105 discussed with respect to FIG. 1). Again, the Cartesian axes X-Y-Z are anchored to the electronic device and thus are rotated relative to the axes in FIG. 1 due to the fact that the electronic device 205 is rotated relative to the depiction in FIG. 1. The electronic device 205 can include an imaging sensor 207 configured to capture optical images and generate resulting optical data (e.g., digital images), as well as a flash component 209 to assist in the capture of the optical images. The electronic device 205 can further include at least one speaker 218 with a grille 238 configured to output audio based on an electrical audio signal. As illustrated in FIG. 1, the speaker 218 is a "built-in" speaker that is commonly utilized to output audio during operation of applications such as music playback, speakerphone, and/or other similar applications (which can be the same as or in contrast to the applications used by the "earpiece" speaker 118 of FIG. 1). As conventionally implemented, the speaker 218 may be recessed within the electronic device 205, whereby the grille 238 both protects the speaker 218 and exposes at least a portion of the speaker 218 to the exterior of the electronic device 205. Further, it should be understood that the positions and locations of the components of the electronic device 205 are merely examples and that other positions and locations for the components are envisioned.

It should be appreciated that the back side of the electronic device 205 can be of various shapes and sizes. For example, the back side of the electronic device 205 can be flat, curved, angled, flexible, or the like. Therefore, in cases in which the back side is curved or angled, for example, the speaker grille 238 may not make direct contact with a surface on which (a portion of) the back side of the electronic device 205 rests. Of course, if the back side is flat and the back side is making direct contact with a surface, then the speaker grille 238 may also make direct contact with the surface unless the grille is recessed.

Although FIG. 2 depicts a single speaker 218, it should be appreciated that multiple speakers 218 on the same side of the electronic device 205 are envisioned, such as two speakers arranged as left-right stereo speakers, two speakers on opposite sides of the electronic device 205, or two speakers ported out the sides of the electronic device 205. Further, it should be appreciated that speakers 218 may be disposed or located on another surface or side of the electronic device 205, such as a bottom surface of the electronic device 205. It should further be appreciated that the various sensors and duplicate audio components of the electronic device 105, 205 may be multiplicatively located on multiple sides of the electronic device 105, 205 or otherwise located on a side of the electronic device 105, 205 that is not depicted in FIGS. 1 and 2. For example, the front side of the electronic device 105 can include the proximity sensor 106 and the back side of the electronic device 205 can also include a proximity sensor. For further example, the speaker 218 can instead be located on the bottom or top (y-direction) of the front side of the electronic device 105.

Returning to FIG. 1, the electronic device 105 further includes a touchscreen 120 and a processor 122. The touchscreen 120 is configured to display visual content and detect touch input from a user of the electronic device 105. In embodiments, a user interface of the electronic device 105 can include the touchscreen 120 via which the user may make selections and generally facilitate functionalities of the electronic device 105 as well as audio and tactile components. The processor 122 may be a singular hardware component or may include three separate processors: an application processor to manage the applications and user interface 120 of the electronic device 105, a sensor processor or sensor hub to manage sensor data, and an audio processor to process audio data. The processor 122 is configured to process data associated the various audio components and sensors (e.g., 102, 110, 106, 108, 112, 114, 116, 207, 218), and facilitate the audio processing and output functionalities as discussed herein. In particular, the processor 122 interfaces with the audio components and sensors to detect various local positions or orientations of the electronic device 105, 205, as well as whether the electronic device 105, 205 is stable. Generally, when the electronic device 105, 205 is stable, it may experience little to no movement relative to a supporting surface. Based on the stability and local positions or orientations, the processor 122 can identify corresponding equalization settings for audio data to be output. According to embodiments, the electronic device 105, 205 is configured to store the equalization settings.

Further, in some embodiments, the equalization settings may be analog equalization data implemented by two or more sets of resistor-inductor-capacitor (RLC) components (generally: an amplifier circuit), where the analog equalization data is selectable by a switch (e.g., a mechanical press switch). In these embodiments, the switch may detect contact with a surface, and may accordingly modify the path of an audio signal through a corresponding amplifier circuit, whereby the amplifier circuit corresponds to an analog equalization setting.

In embodiments, the processor 122 can modify an identified equalization setting based on various factors or data, such as optical data generated by the imaging sensor 108, 207, audio input data generated by the microphone 110, proximity data, and/or accelerometer data. The processor 122 can apply any modified or unmodified equalization setting to an audio signal and cause the speaker 218 to output the audio signal such that the audio signal will be equalized according to the stability, position, and/or orientation of the electronic device 105, 205 and its active speakers and speaker grilles. In some implementations, the audio equalization functionalities may be performed by analog equalization components and/or digital logic.

Figure 3:
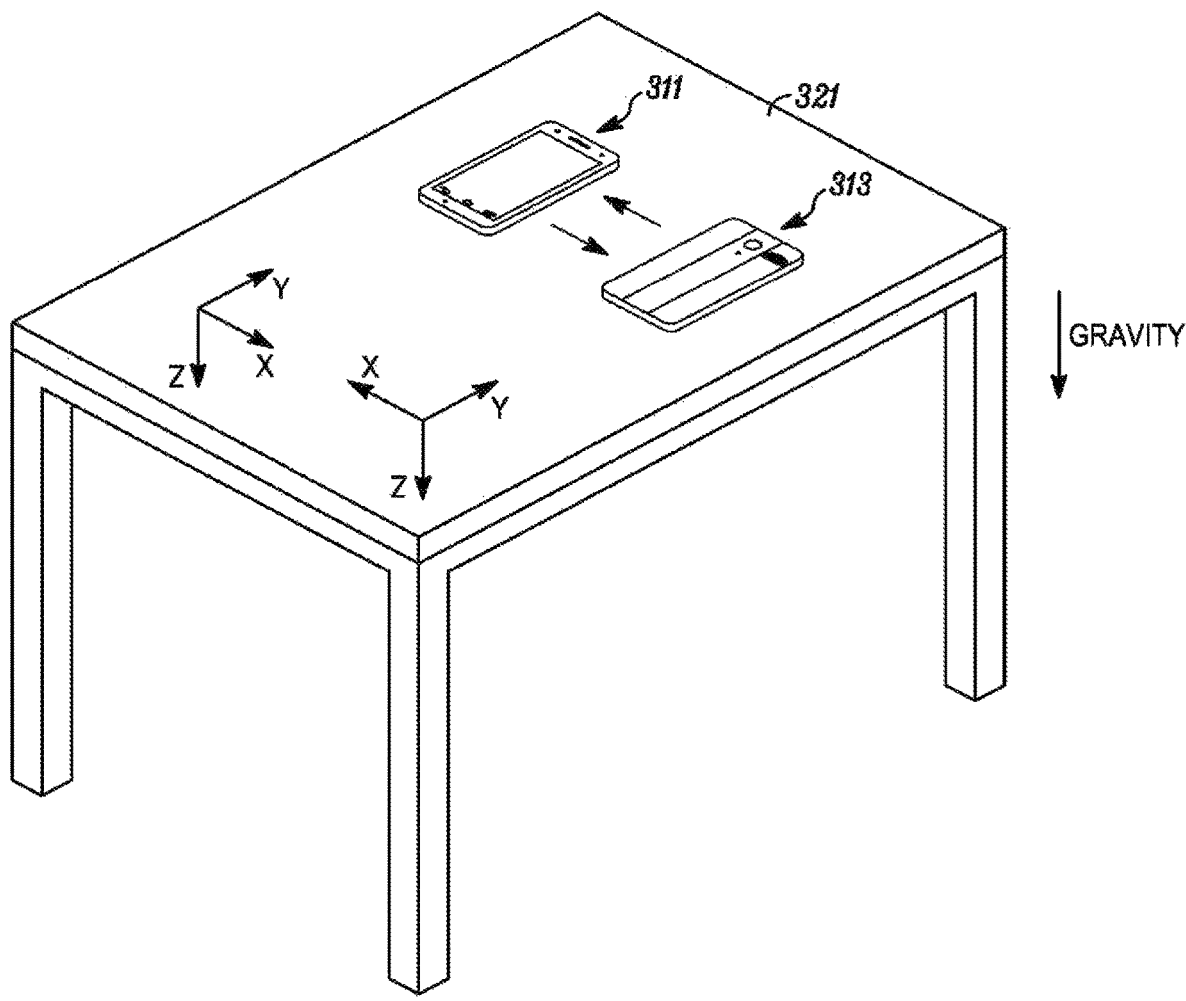
FIGS. 3-5 depict example representations of local positions or orientations of electronic devices, in accordance with some embodiments.

FIG. 3 illustrates example local positions 311, 313 or orientations of an electronic device. For purposes explaining FIG. 3, it may be assumed that the built-in media or "main" speaker of the electronic device (e.g., the speaker 218) may have its grille located on the back side of the electronic device or otherwise opposite from the touchscreen. However, in general, it should be appreciated that the built-in active speaker may be located on the front, top, bottom, or other sides of the electronic device. Further, in some embodiments, an earpiece speaker (e.g., the speaker 118) that is located on the front side of the electronic device may constitute the active speaker via which audio may be output, in lieu of or in addition to a back side built-in speaker. Additionally, the electronic device may include multiple built-in speakers located on various sides or combinations or sides of the electronic device.

The electronic device in the local position 311 is face up on a surface 321 such as a table, desk, counter, or any other surface capable of supporting the electronic device, with its speaker grille or covering face down on the surface 321. Similarly, the electronic device in the local position 313 is face down on the surface 321 with its speaker grille face up. In embodiments in which the electronic device is in the face up local position 311, the gyroscope (e.g., the gyroscope 114) and the accelerometer (e.g., the accelerometer 116) detects that the main speaker 218 is oriented in a downward direction with respect to gravity and stable, and the proximity sensor (e.g., the proximity sensor 106) does not sense proximate contact with any surface. Then, the processor (e.g., the processor 122 or other logic circuitry) can determine that the electronic device is face up and stable and infer that it is supported relative to the surface 321. Accordingly, the processor can identify a "stable, face up" equalization setting corresponding to the local position 311. In particular, the "stable, face up" equalization setting can account for the downward orientation of the speaker (i.e., the speaker grille is oriented towards the surface 321). It should be appreciated that the processor may determine the "stable, face up" configuration using other combinations of sensors. As discussed herein, if the speaker grille is oriented towards the surface 321, the speaker grille may or may not make direct contact with the surface 321.

In embodiments in which the electronic device is in the local position 313, the gyroscope and the accelerometer detects that the speaker is oriented in an upward direction with respect to gravity and stable, and the proximity sensor (e.g., the proximity sensor 106) senses proximate contact with the surface 321. In this case, the processor can infer that the electronic device is face down and stable. Accordingly, the processor can identify a "stable, face down" equalization setting corresponding to the local position 313. In particular, the "stable, face down" equalization setting can account for the upward orientation of the speaker (i.e., the speaker grille is not oriented towards the surface 321).

In some embodiments, the electronic device can additionally or alternatively retrieve data from one or more imaging sensors (e.g., the imaging sensors 108, 209) to help determine the local position. For example, if a rear-facing imaging sensor (e.g., the imaging sensor 207) detects a dark local environment and a front-facing imaging sensor (e.g., the imaging sensor 108) detects a light local environment, the processor can determine that the electronic device is face up (and vice-versa for a face-down determination). Further, as described in more detail below, the one or more imaging sensors may be configured to analyze image data of the listener to determine the angle of the electronic device relative to the listener.

There may be situations in which there is conflicting sensor data related to the stability and/or orientation of the electronic device. For example, a proximity sensor and an ultrasonic sensor may sense conflicting surface proximity data. In these situations, the electronic device may support a hierarchy or priority that dictates which sensor data to use and which sensor data to disregard. It should be appreciated that the hierarchy or priority may order the various sensors of the electronic device in any order, and may be a default setting and/or configurable by a user.

Figure 4:
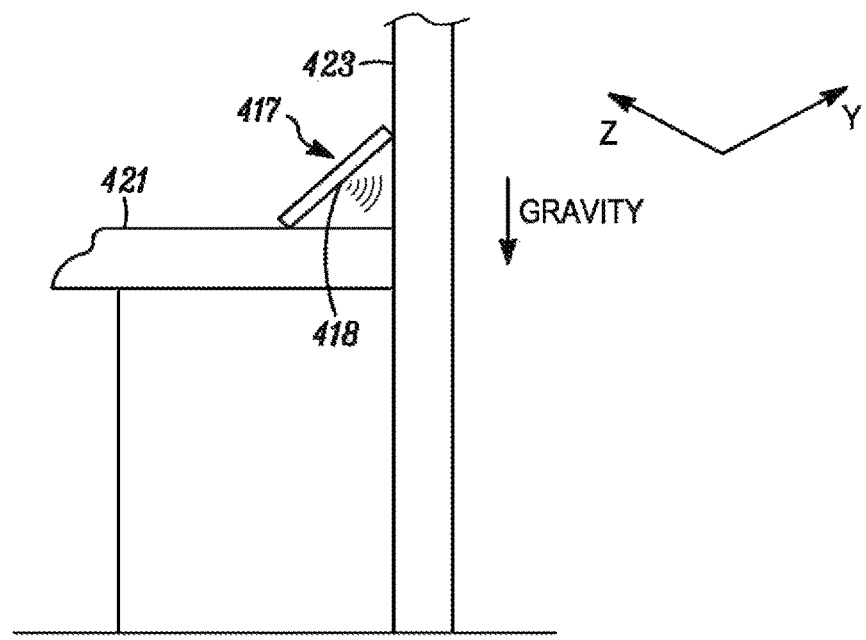

FIG. 4 illustrates an example local position 417 or orientation of an electronic device. Specifically, the electronic device in the local position 417 has one edge supported by a horizontal surface 421 and another edge supported by a vertical surface 423 such that neither the front side nor the back side of the electronic device makes direct contact with one of the supporting surfaces 421, 423. It should be appreciated that other orientations in which the electronic device is indirectly supported by multiple surfaces is envisioned.

In some embodiments in which the electronic device is in the local position 417, the gyroscope (e.g., the gyroscope 114) and the accelerometer (e.g., the accelerometer 116) detects that a speaker grille 418 is stable and at least partially oriented toward the supporting surfaces 421, 423, and the proximity sensor (e.g., the proximity sensor 106 or the proximity sensor 209) does not sense direct or proximate contact with any of the surfaces 421, 423. Then, the processor (e.g., the processor 122) can determine that the electronic is face up, stable, and indirectly supported. Accordingly, the processor can identify a "stable, face up, indirect support" equalization setting corresponding to the local position 417. In particular, the "stable, face up, indirect support" equalization setting can account for the speaker grille 418 oriented toward the supporting surfaces 412, 423 but not making direct or proximal contact with the supporting surfaces 412, 413. In embodiments, the proximity sensor may be located next to or proximate the speaker grille 418 to sense or detect when the covering of the speaker grille 418 is in close contact with either of the supporting surfaces 421, 423.

Figure 5:
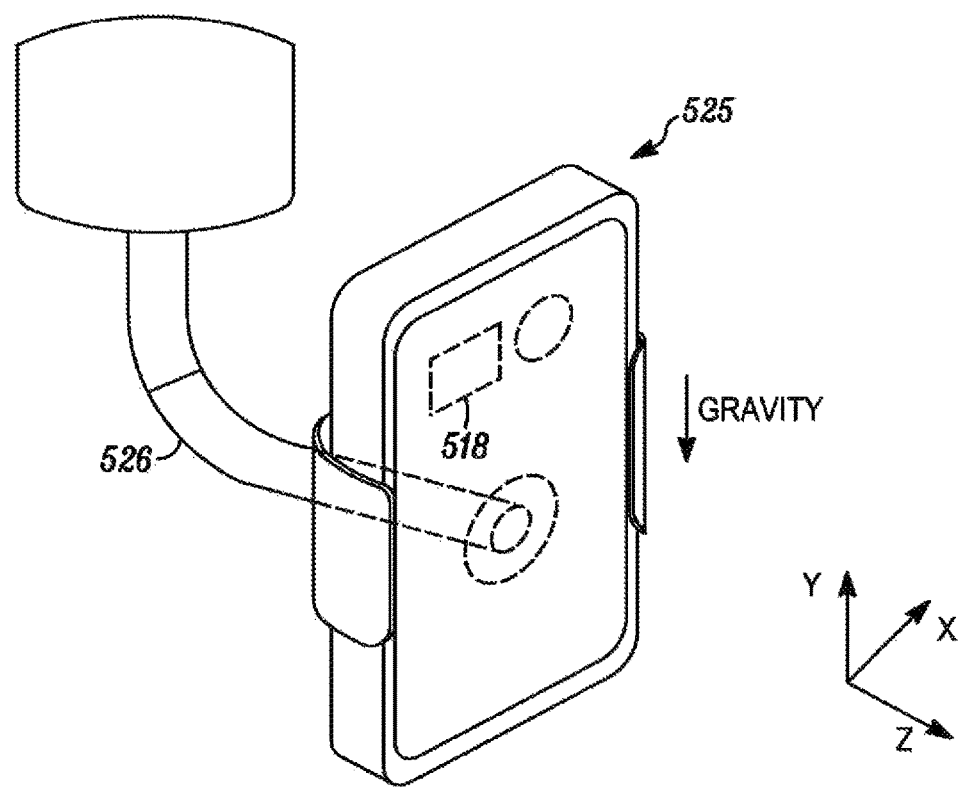

FIG. 5 illustrates an example local position 525 or orientation of an electronic device. Specifically, the electronic device in the local position 525 is supported by an example mount 526, dock, or holder. For example, the mount 526 may be a vehicle windshield mount that provides support for the electronic device when traveling in a vehicle. As illustrated in FIG. 5, the mount 526 supports the electronic device on its bottom and sides and allows a speaker grille 518 and corresponding speaker to be exposed (but oriented away from a listener such as a vehicle driver or passenger). In some embodiments, the electronic device can sense that it is supported by the mount 526 via a Hall effect magnet or other type of sensor or component configured to detect when the electronic device is connected or secured to the mount 526 (e.g., USB, NFC, ultrasound, custom connector, etc.). In other embodiments, the electronic device can determine that it is supported by the mount 526 from gyroscope orientation data and/or accelerometer acceleration data. For example, if the orientation data indicates that the "x" or "y" dimension of the electronic device is "up" (i.e., the electronic device is perpendicular or near perpendicular to gravity) with a relatively small amount of "tilt," then the electronic device can conclude that it is supported by the mount 526. In embodiments, the electronic device can determine different orientations, such as if the mount 526 enables both portrait and landscape orientations.

In some embodiments in which the electronic device is in the local position 525, the gyroscope (e.g., the gyroscope 114) and the accelerometer (e.g., the accelerometer 116) detects that the electronic device is stable or supported, and a location module (e.g., the location module 112) detects that the electronic device is in motion. Then, the processor (e.g., the processor 122) can determine that the electronic device is stable and supported by the mount 526. In some cases, the acceleration data from the accelerometer can imply both that the electronic device is stable and that the electronic device is in motion (i.e., not stationary), for example in a vehicle. Accordingly, the processor can identify a "stable contact/mounted" equalization setting corresponding to the local position 525. In particular, the "stable contact/mounted" equalization setting can account for the speaker grille 518 oriented away from a user or person whereby the "x" or "y" dimension of the electronic device is "up" or close to "up" with respect to gravity. It should be appreciated that there may be different equalization settings depending on the type of the mount 526, to account for how the speaker grille 518 is oriented, whether the speaker grille 518 is blocked by the mount 526, or other considerations.

Although not illustrated in the figures, it should be appreciated that the electronic device may use other types of data from other sensors to determine its local position, orientation, or environment. For example, location data from a location module such as a GPS module can indicate that the electronic device is indoors, outdoors, in a car, or in another environment. For further example, if the electronic device is connected to a wireless local area network (WLAN), the electronic device can hypothesize that it is in an indoor environment. Additionally, if the electronic device detects that it is being charged (e.g., via a USB cord), then the electronic device can deduce that it may remain in the same location or position for a period of time. Further, the electronic device may account for an auxiliary battery pack that charges the electronic device. Moreover, the electronic device can examine optical data from the imaging sensor(s) to deduce whether the electronic device is in an indoor or outdoor environment. According to embodiments, the electronic device can store or maintain equalization settings that correspond to these and other environments or local positions.

In some embodiments, the electronic device may account for multiple speakers from which to output audio data. In cases in which the electronic device has multiple internal or built-in speakers, each of the internal speakers may have an individual equalization setting. Further, the electronic device may connect to an auxiliary speaker (e.g., via a wired or wireless connection) to output audio in addition to the one or more built-in speakers of the electronic device. Accordingly, the one or more built-in speakers may output audio data that is processed according to the determined local position of the electronic device (as well as the respective equalization setting(s)), and the electronic device may further apply a default equalization to the audio data and provide that audio data to the auxiliary speaker for output. In some cases, the electronic device may apply the same equalization setting to each built-in speaker(s) as well as any auxiliary speaker(s). In other cases, the electronic device may apply different equalization settings to respective audio data that is to be output by the multiple speakers, such as in cases in which the multiple speakers are oriented differently with respect to a user, when multiple speakers are loaded differently by an adjacent surface or lack or surface, or in cases in which each speaker corresponds to a different frequency (e.g., one built-in speaker serves as a tweeter, another built-in speaker serves as a mid-range, and an auxiliary speaker serves as a woofer). In some embodiments, any equalization(s) applied to auxiliary speaker(s) may align the output(s) of the speaker(s) to any listener(s), whereby the auxiliary speaker(s) may have imaging sensor(s) configured to detect relative locations of the listener(s) so that the electronic device can send signal(s) to the speaker(s) that are time-aligned for the listener of choice.

Figure 6:
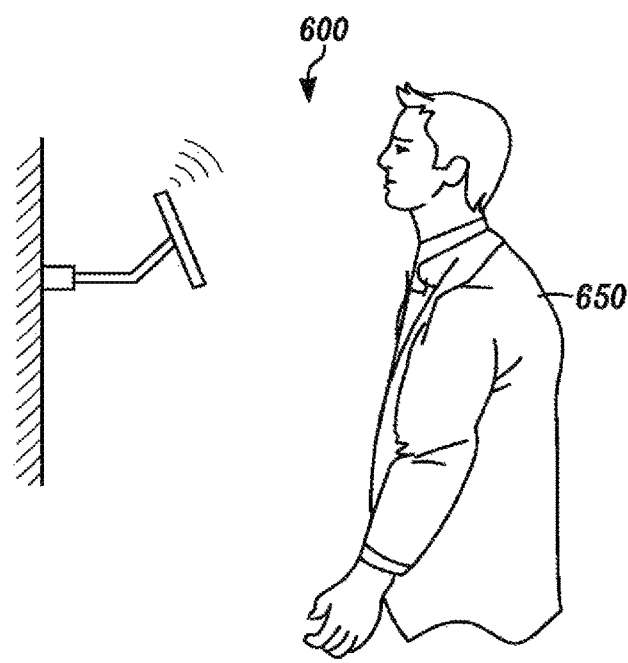
FIGS. 6 and 7 depict example representations of a user interacting with electronic devices, in accordance with some embodiments.

FIG. 6 depicts an example representation 600 of a user 650 positioned near an electronic device 605. The electronic device 605 may be supported by a mount as illustrated in FIG. 6. As discussed herein, the electronic device 605 may include one or more imaging sensors that are configured to generate optical data corresponding to the field of view of the imaging sensor(s). For example, the electronic device may include a front-facing imaging sensor (e.g., the imaging sensor 108) and a rear-facing imaging sensor (e.g., the imaging sensor 209) that together enable a "360 degree" field of view. The electronic device 605 can analyze the optical data to detect the presence of the user 650 as well as determine the position of the user 650 relative to the electronic device 605. For example, if optical data from a front-facing imaging sensor detects the user 650, the electronic device 605 can determine that the user 650 is at least positioned in front of the electronic device 605.

To identify an appropriate equalization setting to apply to audio data given the local orientation of the electronic device 605 active speaker grille relative to its surroundings, the electronic device 605 can reconcile the determined position of the user 650 with location or position data corresponding to one or more speakers of the electronic device 605. For example, if a speaker is located on the rear side of the electronic device 605 and the optical data from a front-facing camera indicates that the user 650 is positioned in front of the electronic device 605, the electronic device 605 can identify an equalization setting that corresponds to the speaker oriented away from the user 650. Similarly, for the same speaker located on the rear side of the electronic device 605, if the optical data from a rear-facing camera indicates that the user 650 is positioned on the rear side of the electronic device 605, the electronic device 605 can identify an equalization setting that corresponds to the user 650 having a direct line to the speaker. The optical data may also indicate multiple listeners (including the user 650) in proximity to the electronic device 605. In this case, the electronic device 605 may be configured to perform various facial recognition or machine learning techniques to identify the "primary" listener (e.g., the owner of the electronic device 605) and may identify/apply the equalization setting accordingly. In some embodiments, if the optical data indicates multiple listeners, the electronic device may select or revert to a preferred or default equalization setting (e.g., an equalization setting corresponding to a single user in front of a stable electronic device).

Figure 7:
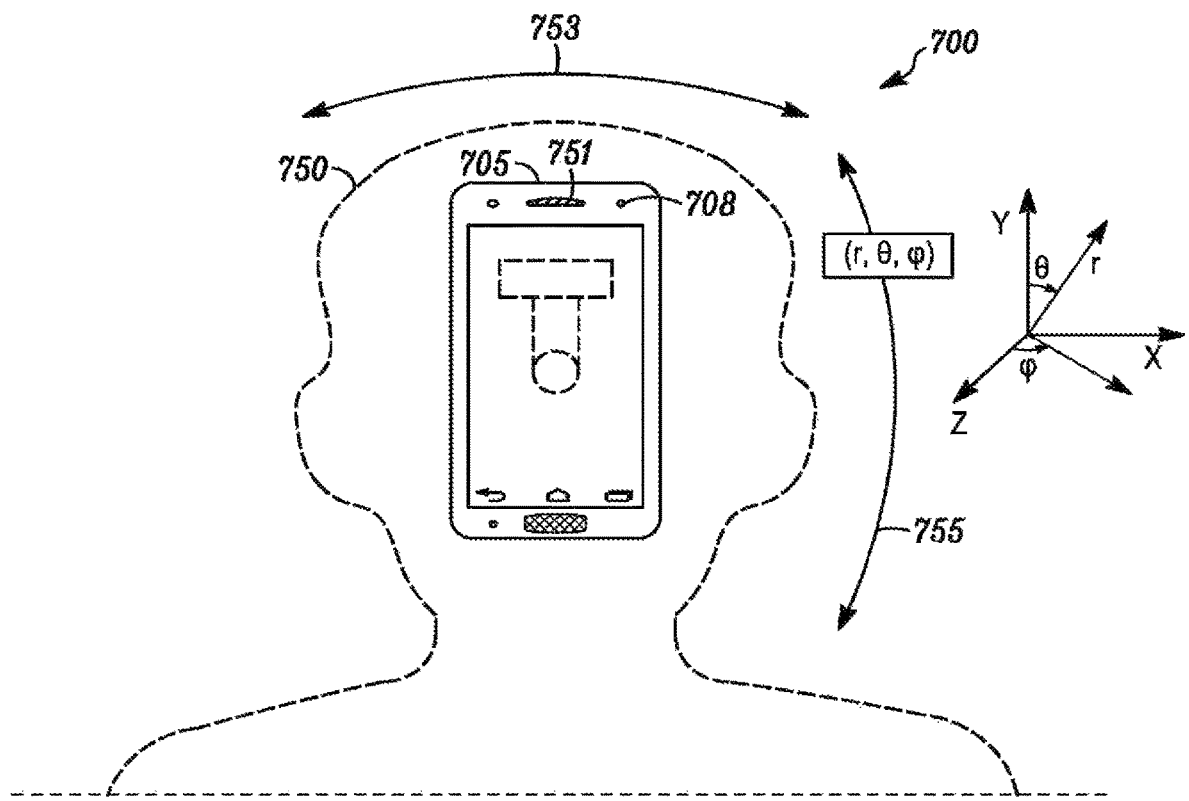

The user 650 may also change his or her position relative to the electronic device 605, which can affect tonality or the quality of the audio experienced by the user 650. In particular, as a user 750 as depicted in FIG. 7 moves on or off an axis of the speaker, the audio experienced by the user can change. FIG. 7 depicts an example representation 700 of a user's movements in relation to an electronic device 705 (e.g., in the x- and/or y-directions). The example electronic device 705 includes a front-facing imaging sensor 708 and a front-facing speaker 751, whereby the user 750 is positioned facing the front side of the electronic device 705.

The optical data generated by the imaging sensor 708 may indicate a change in position of the user 750, for example as a result of the user 750 moving his or her head relative to the electronic device 705. In any case, the user 750 may change his or her position in a variety of directions (753, 755) relative to both the imaging sensor 708 and the speaker 751. As the user 750 changes his or her position, the user 750 may experience varied audio playback. For example, the audio that the user 750 hears when directly perpendicular to the axis of the speaker 751 may be different from the audio that the user 750 hears when positioned at an 70° angle from the axis of the speaker 751. Based on the change in position indicated in the optical data, the electronic device 705 can dynamically modify the equalization settings to be applied to the audio signal, and can output the equalized audio data so as to account for the new position of the user 750. In some embodiments, the electronic device 705 may maintain a lookup table of equalization settings matched to angle (e.g., in the θ and φ dimensions or their Cartesian equivalents) to account for the position of the user 750 relative to the speaker output axis.

Figure 8B:
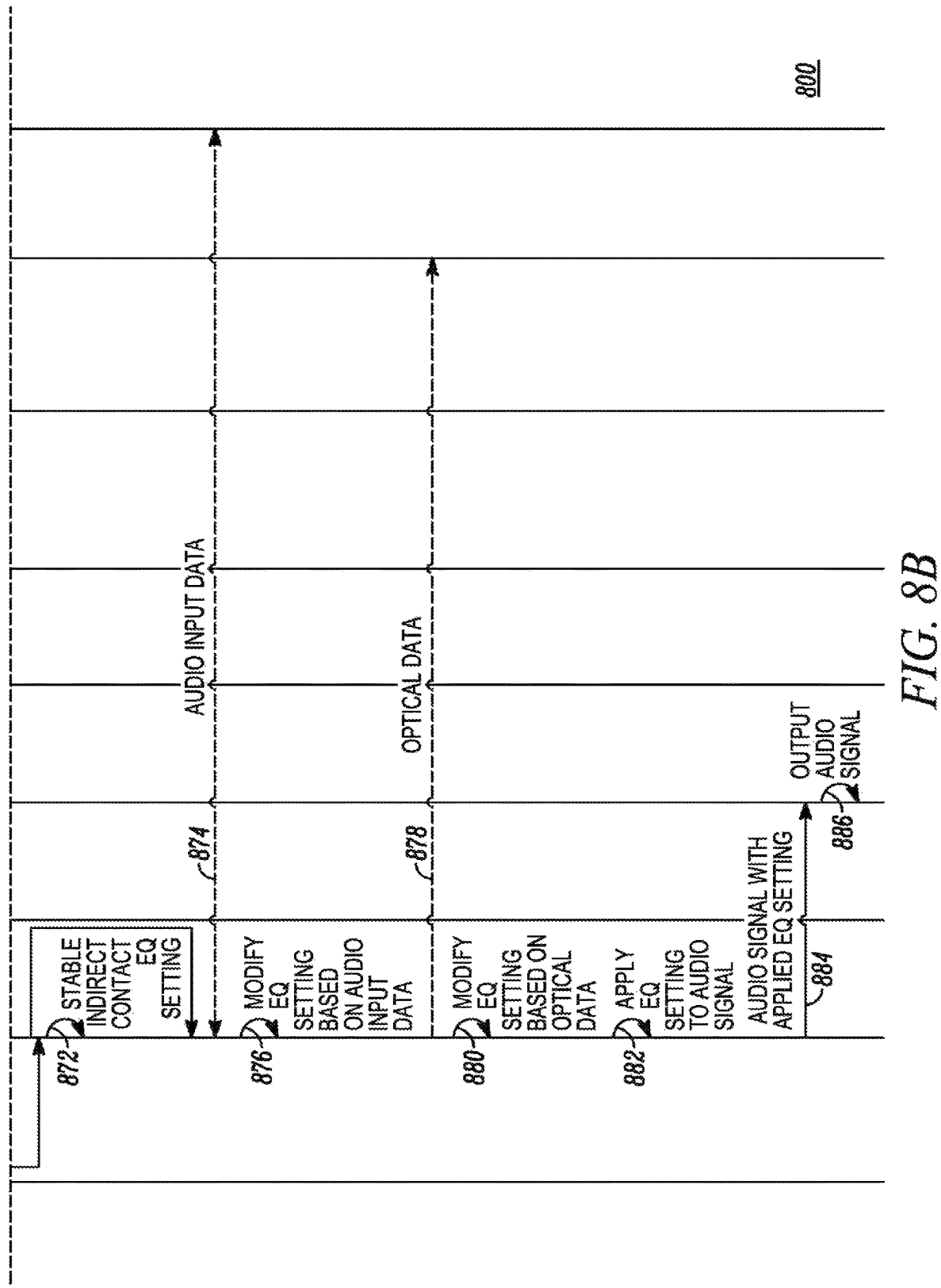

FIGS. 8A and 8B depict an example signaling diagram 800 facilitated by an electronic device and associated with processing audio data according to local positions or orientations of the electronic device. The electronic device can include a processor 822 (such as the processor 122 discussed with respect to FIG. 1), a sensor hub 820, a speaker 818 (such as the speaker 218 discussed with respect to FIG. 2), a gyroscope 814 (such as the gyroscope 114 discussed with respect to FIG. 1), an accelerometer 816 (such as the accelerometer 116 discussed with respect to FIG. 1), a proximity sensor 806 (such as the proximity sensor 106 discussed with respect to FIG. 1), an imaging sensor 808 (such as the imaging sensor 108 discussed with respect to FIG. 1), and a microphone 810 (such as the microphone 110 discussed with respect to FIG. 1). In another embodiment, simple digital logic may be used to implement the functionalities of the signaling diagram 800.

As illustrated in FIG. 8, the gyroscope 814 may periodically, intermittently, or continuously transmit (854) orientation data to the sensor hub 820 and the accelerometer 816 may periodically, intermittently, or continuously transmit (856) acceleration data to the sensor hub 820. In embodiments, the sensor hub 820 may request the gyroscope 814 and the accelerometer 816 for orientation data and acceleration data, respectively. The processor 822 may periodically, intermittently, or continuously request (855) a sensor-derived state of the electronic device from the sensor hub 820, where the sensor-derived state may be identified from the most recent orientation data and acceleration data.

The functionalities may continue with a user 850 of the electronic device requesting (852) audio playback. For example, the user 850 can interface with a music streaming application and request to initiate playback of a playlist or song. The processor 822 can examine the sensor-derived state of the electronic device retrieved in 855 to determine (858) whether the electronic device is stable. In some cases, the processor 822 can deduce that the electronic device is stable if the orientation data and the acceleration data indicate that the electronic device is not moving. In other cases, the processor 822 can deduce that the electronic device is stable if the orientation data and the acceleration data indicate that the electronic device is in motion but is supported (e.g., if the electronic device is secured in a mount in a vehicle).

If the processor 822 determines 858 that the electronic device is not stable ("NO"), for example if the user 850 is holding the electronic device, the processor 822 can apply (860) a default equalization setting (or, in some cases, a handheld equalization setting) to an audio signal and provide (862) the audio signal with the applied default equalization setting to the speaker 818. The speaker 818 can output (864) the audio signal with the applied default equalization setting. If the processor 822 determines that the electronic device is stable ("YES"), the processor 822 can retrieve (866) proximity data from the proximity sensor 806. Based on the proximity data, the processor 822 can determine (868) whether a portion of the electronic device (or more particularly, the proximity sensor 806) senses proximity to an external object or surface. If the processor 822 determines 868 that the proximity sensor 806 senses proximity to the surface ("YES," for example the local position 313 illustrated in FIG. 3), the processor 822 can identify (870) a "stable direct contact" equalization setting. In contrast, if the processor 822 determines that the proximity sensor 806 does not sense proximity to the surface ("NO." for example the local positions 311 and 415 illustrated in FIGS. 3 and 4), the processor 822 can identify (872) a "stable indirect contact" equalization setting. In an optional embodiment, the proximity sensor 806 (or in some cases an ultrasonic sensor or another sensor) may detect a distance from a speaker grille (such as the speaker grille 238) of the electronic device to the surface. In this implementation, the processor 822 may identify an equalization setting that is additionally based on the distance from the electronic device to the surface (which may be the same as or different from the "stable indirect contact" equalization setting identified in 872).

In an optional embodiment, the processor 822 can retrieve (874) audio input data from the microphone 810. In some embodiments, the audio input data can include microphone feedback present in various environments (e.g., indoor, outdoor, etc.). The processor 822 can optionally modify (876) the equalization setting based on the audio input data. In another optional embodiment, the processor 822 can retrieve (878) optical data from the imaging sensor 808 (and optionally from an additional imaging sensor). The optical data can detect a presence of the user 850 and can indicate the location of the user 850 relative to the location of the speaker 818 (e.g., if the user 850 is facing the front side of the electronic device and the speaker 818 is on the opposite side of the electronic device). Further, the optical data can indicate a change in the location of the user 850 relative to the axis (i.e., a perpendicular direction) of the speaker 818. The change in the location of the user 850 may also be characterized by angle(s) of the user 850 relative to axis(es) of the electronic device speaker, whereby the electronic device may maintain/access a lookup table storing various equalization settings based on the angle(s). According to embodiments, the user 850 may experience different audio tonalities as the user 850 moves "off" or "on" the axis of the speaker 818. The processor 822 can optionally modify (880) the equalization setting based on the optical data.

The processor 822 can apply (882) the modified or unmodified equalization setting to the audio signal. Further, the processor 822 can provide (884) the audio signal with the applied equalization setting to the speaker 818 and the speaker 818 can output (886) the audio signal with the applied equalization setting. In embodiments, the local position of the electronic device may change, and the processor 822 can dynamically identify other various equalization settings based on the change in local position. Further, the processor 822 can perform the equalization setting modification, audio data application, and audio output functionalities based on the changed local position.

Figure 9:
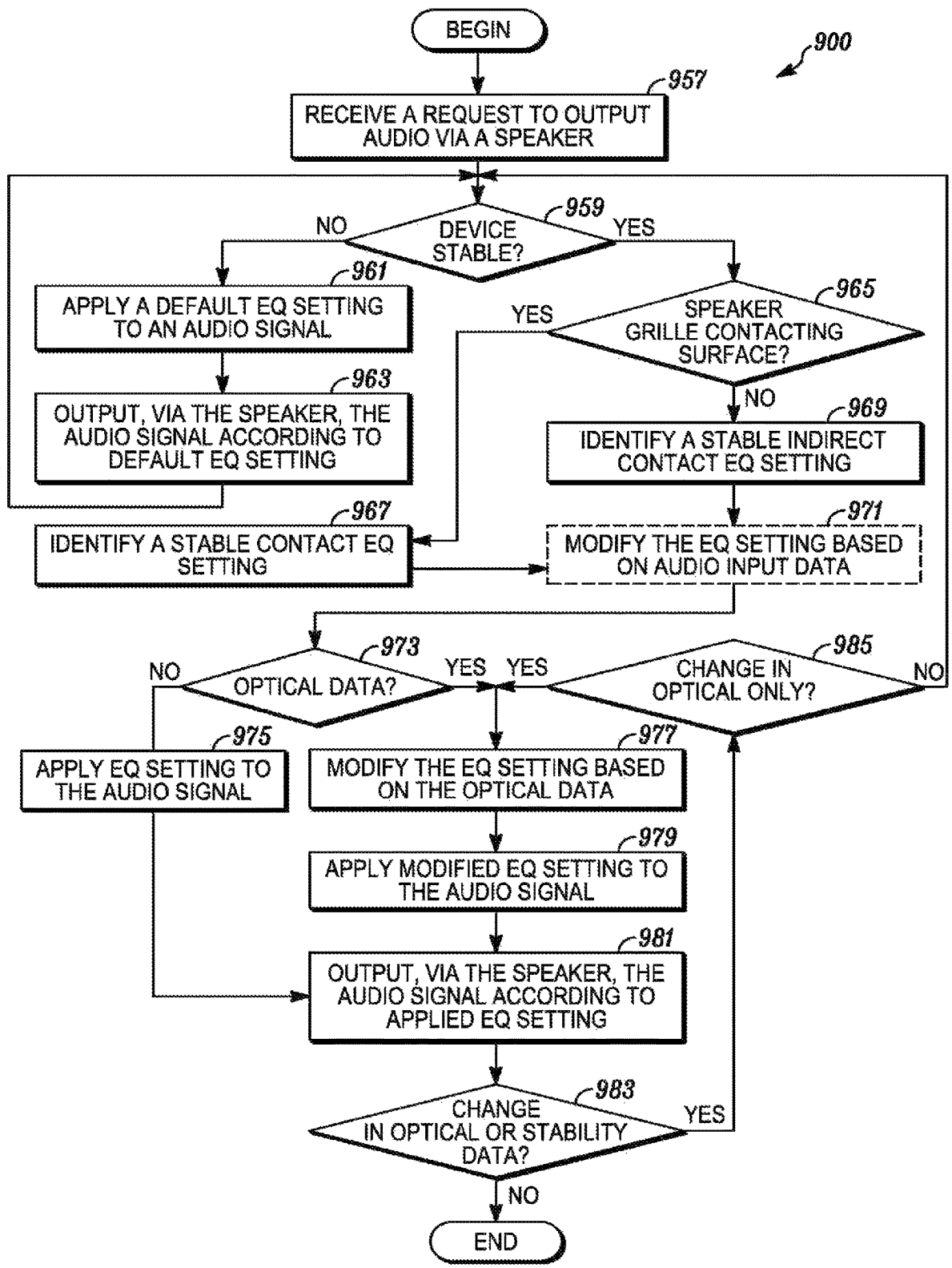
FIG. 9 depicts a flow diagram of retrieving sensor data and processing audio data associated with an electronic device, in accordance with some embodiments.

FIG. 9 is a flowchart of a method 900 for an electronic device (such as the electronic device 105) to process various sensor data and facilitate audio equalization techniques based on the sensor data. The order of the steps of the depicted flowchart of FIG. 9 can differ from the version shown, and certain steps can be eliminated, and/or certain other ones can be added, depending upon the implementation. The method 900 begins with the electronic device receiving 957 a request to output audio via a speaker. The request may be received from a user via a user selection or may be automatically detected via another type of trigger (e.g., a voice command, an NFC detection, a scheduled trigger, etc.).

The electronic device determines 959 if it is stable by examining acceleration data from an accelerometer and/or orientation data from a gyroscope. In another embodiment, the electronic device may retrieve a sensor-derived state of the electronic device from a sensor hub. If the electronic device is not stable ("NO"), the electronic device identifies a default equalization setting and applies 961 the default equalization setting to an audio signal. The default equalization setting may be a standard or universal equalization setting that is used for example when the local position of the electronic device is indeterminate. The electronic device also outputs 963, via the speaker, the audio signal according to the default equalization setting. Processing can then return to 959 or proceed to other functionality.

If the electronic device is stable ("YES"), the electronic device determines 965 if its speaker grille is contacting or proximate to a surface by examining proximity data from a proximity sensor (or via other sensors such as an ultrasonic sensor, an infrared sensor, or others). If the proximity data does not indicate contact or proximity ("NO"; e.g., if the electronic device is leaning against a surface and the speaker grille is not supported by the surface), the electronic device identifies 969 a stable indirect contact equalization setting. In some cases, the speaker grille may be orientated away from a support surface, whereby the electronic device may identify an away-oriented equalization setting. If the proximity data does indicate contact or proximity ("YES"; e.g., if the electronic device is laying flat on a surface and the speaker grille is facing the surface), the electronic device identifies 967 a stable contact equalization setting. In embodiments, the electronic device can also identify the equalization setting based on the orientation of the speaker (e.g., if the speaker (and corresponding speaker grille) is face up or face down). In some cases, the electronic device may not be able to determine whether it is stable, in which case the electronic device may estimate its distance to the surface (e.g., via proximity data) and apply equalization data accordingly.

In an optional embodiment, the electronic device retrieves audio input data, for example from a microphone, and modifies 971 the identified equalization setting based on the audio input data. For example, if the microphone detects background noise, the electronic device can modify the equalization setting to account for the background noise. The electronic device further determines 973 if there is any optical data, such as if an imaging sensor detects a presence of a user positioned relative to the speaker. If optical data is not available or no user is found in the optical data ("NO"), the electronic device applies 975 the identified equalization setting to the audio signal. If there is optical data and a user is found in the optical data ("YES"), the electronic device modifies 977 the identified equalization setting based on the optical data. For example, the optical data can indicate that the user is positioned on a side of the electronic device opposite from the speaker. For further example, the optical data can indicate that the user is positioned at a certain angle relative to an axis of the speaker. The electronic device applies 979 the modified equalization setting to the audio signal.

After applying the equalization setting, the electronic device outputs 981, via the speaker, the audio signal according to the applied equalization setting. The electronic device also determines 983 if there is a change in the optical or stability data, such as if the user adjusts his or her position relative to the speaker. In this case, the imaging sensor generates updated optical data corresponding to the user's change in position. If there is only a change in the optical data 985 ("YES"), processing may return to 977 in which the electronic device modifies the equalization setting based on the updated optical data. If there is a change in data other than optical data (such as a change in stability data) ("NO"), processing may return to 959. The determinations of 983 and 985 may be may be repeated periodically or when triggered by a change in optical or stability inputs. If there is not a change in the optical or stability data in 983 ("NO"), processing may end or proceed to other functionality. In some embodiments, the electronic device may further modify the equalization setting based on GPS location and/or acoustic loading.

Figure 10:
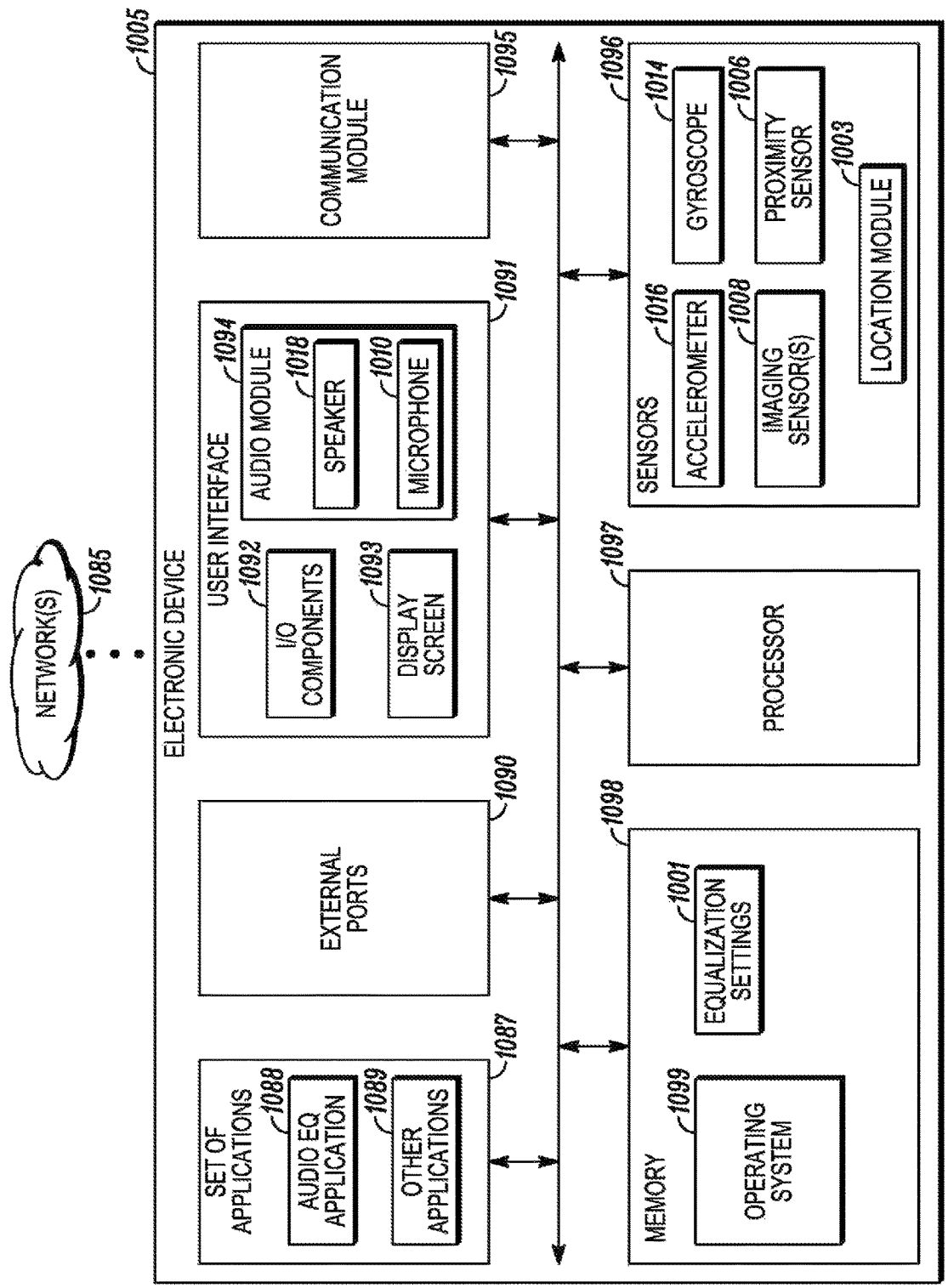
FIG. 10 is a block diagram of an electronic device in accordance with some embodiments

FIG. 10 illustrates an example electronic device 1005 (such as the electronic device 105 discussed with respect to FIG. 1, or other devices) in which the functionalities as discussed may be implemented. The electronic device 1005 can include a processor 1097 or other similar type of controller module or microcontroller, as well as a memory 1098. The processor 1097 may include a singular processor or may include more than one separate processor such as: an application processor to manage the applications 1087 and user interface 1091 of the electronic device 1005, a sensor processor to manage sensor 1096 data, and an audio processor to process audio 1094 data. The memory 1098 can store an operating system 1099 capable of facilitating the functionalities discussed. The processor 1097 can interface with the memory 1098 to execute the operating system 1099 and a set of applications 1087. The set of applications 1087 (which the memory 1098 can also store) can include an audio equalization application 1088 configured to process audio data according to the techniques discussed. The set of applications 1087 can also include one or more other applications 1089 such as, for example, music and entertainment applications, phone applications, messaging applications, calendar applications, social networking applications, utilities, productivity applications, games, travel applications, communication application, shopping applications, finance applications, sports applications, photography applications, mapping applications, weather applications, applications for connecting to an online marketplace, and/or other applications.

The memory 1098 can further store a set of equalization settings 1001 that correspond to various local positions or orientations of the electronic device 1005. According to embodiments, the audio equalization application 1088 can interface with the equalization settings 1001 to retrieve appropriate equalization settings to apply to audio data. Generally, the memory 1098 can include one or more forms of volatile and/or non-volatile, fixed and/or removable memory, such as read-only memory (ROM), electronic programmable read-only memory (EPROM), random access memory (RAM), erasable electronic programmable read-only memory (EEPROM), and/or other hard drives, flash memory. MicroSD cards, and others.

The electronic device 1005 can further include a communication module 1095 configured to interface with one or more external ports 1090 to communicate data via one or more wired or wireless networks 1085. For example, the communication module 1095 can leverage the external ports 1090 to establish a wide area network for connecting the electronic device 1005 to other components such as a remote data server. According to some embodiments, the communication module 1095 can include one or more transceivers functioning in accordance with IEEE standards, 3GPP standards, or other standards, and configured to receive and transmit data via the one or more external ports 1090. More particularly, the communication module 1095 can include one or more WWAN, WLAN, and/or WPAN transceivers configured to connect the electronic device 1005 to wide area networks (e.g., to receive steaming music that may be pre-equalized for the electronic device 1005), local area networks, and/or personal area networks. The electronic device 1005 may further use one of the external ports 1090 to connect to peripheral or auxiliary components such as an auxiliary speaker.

The electronic device 1005 can further include one or more sensors 1096 such as one or more accelerometers 1016, gyroscopes 1014, imaging sensors 1008, proximity sensors 1006, a presence sensor (not shown in FIG. 10), one or more ultrasonic sensors (not shown in FIG. 10) and location modules 1003. The sensors 1096 may also include other types of sensors such as light sensors, infrared sensors, touch sensors. NFC components, and other sensors. The electronic device 1005 may further include a user interface 1091 configured to present information to the user and/or receive inputs from the user. As illustrated in FIG. 10, the user interface 1091 includes a display screen 1093 and I/O components 1092 (e.g., capacitive or resistive touch sensitive input panels, keys, buttons, lights, LEDs, cursor control devices, haptic devices, and others). In embodiments, the display screen 1093 is a touchscreen display using singular or combinations of display technologies and can include a thin, transparent touch sensor component superimposed upon a display section that is viewable by a user. For example, such displays include capacitive displays, resistive displays, surface acoustic wave (SAW) displays, optical imaging displays, and the like. The user interface 1091 may further include an audio module 1094 including hardware components such as one or more speakers 1018 for outputting audio data and one or more microphones 1010 for detecting or receiving audio.

In general, a computer program product in accordance with an embodiment includes a computer usable storage medium (e.g., standard random access memory (RAM), an optical disc, a universal serial bus (USB) drive, or the like) having computer-readable program code embodied therein, wherein the computer-readable program code is adapted to be executed by the processor 1097 (e.g., working in connection with the operating system 1099) to facilitate the functions as described herein. In this regard, the program code may be implemented in any desired language, and may be implemented as machine code, assembly code, byte code, interpretable source code or the like (e.g., via C, C++. Java. Actionscript. Objective-C. Javascript, CS S, XML, and/or others).

Generally, frequency response is the measure of a speaker's audio output as a function of frequency, in comparison to an input signal. Manufacturers of speakers may wish to reproduce the input signal with little or no distortion. However, a listener of outputted audio from an electronic device may experience different frequency responses when the device (and the speaker(s) of the device) are in different positions or orientations. As discussed herein, the systems and methods apply different equalization settings to an input signal when the electronic device is in different positions or orientations, in an effort to accurately reproduce the input audio signal as it was meant to be heard.

Figure 11:
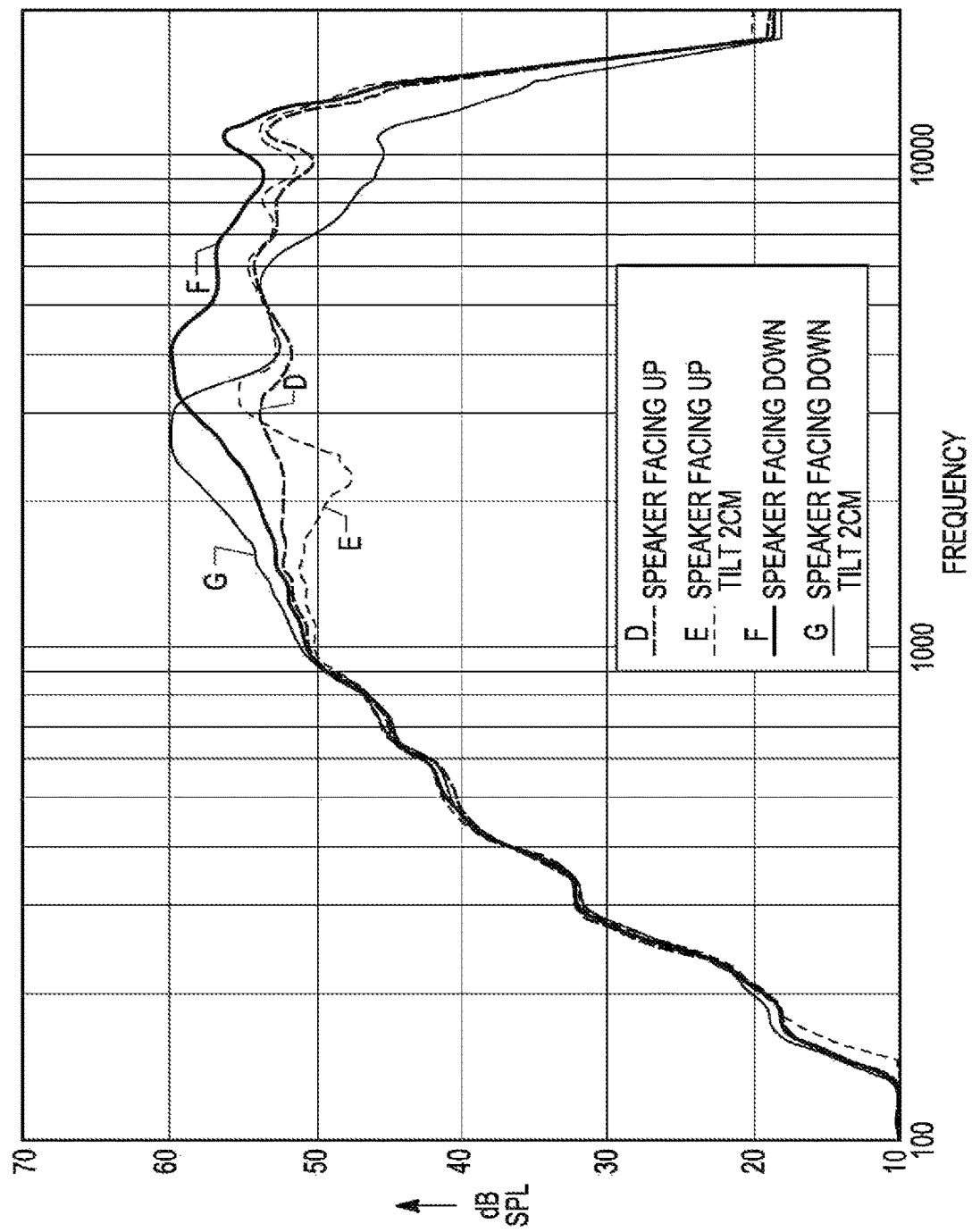
FIGS. 11-13 depict example frequency response graphs, in accordance with some embodiments.
Figure 12:
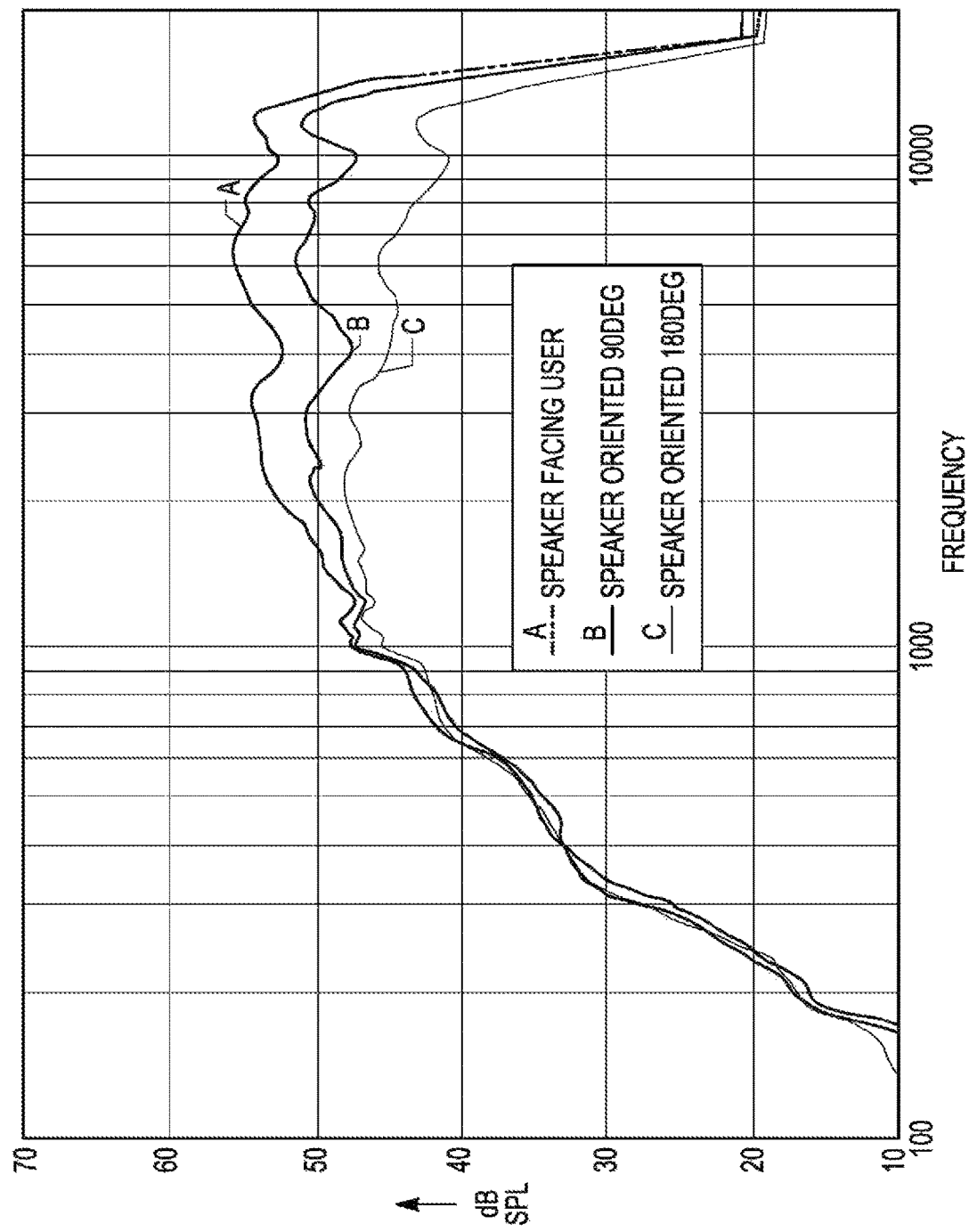
Figure 13:
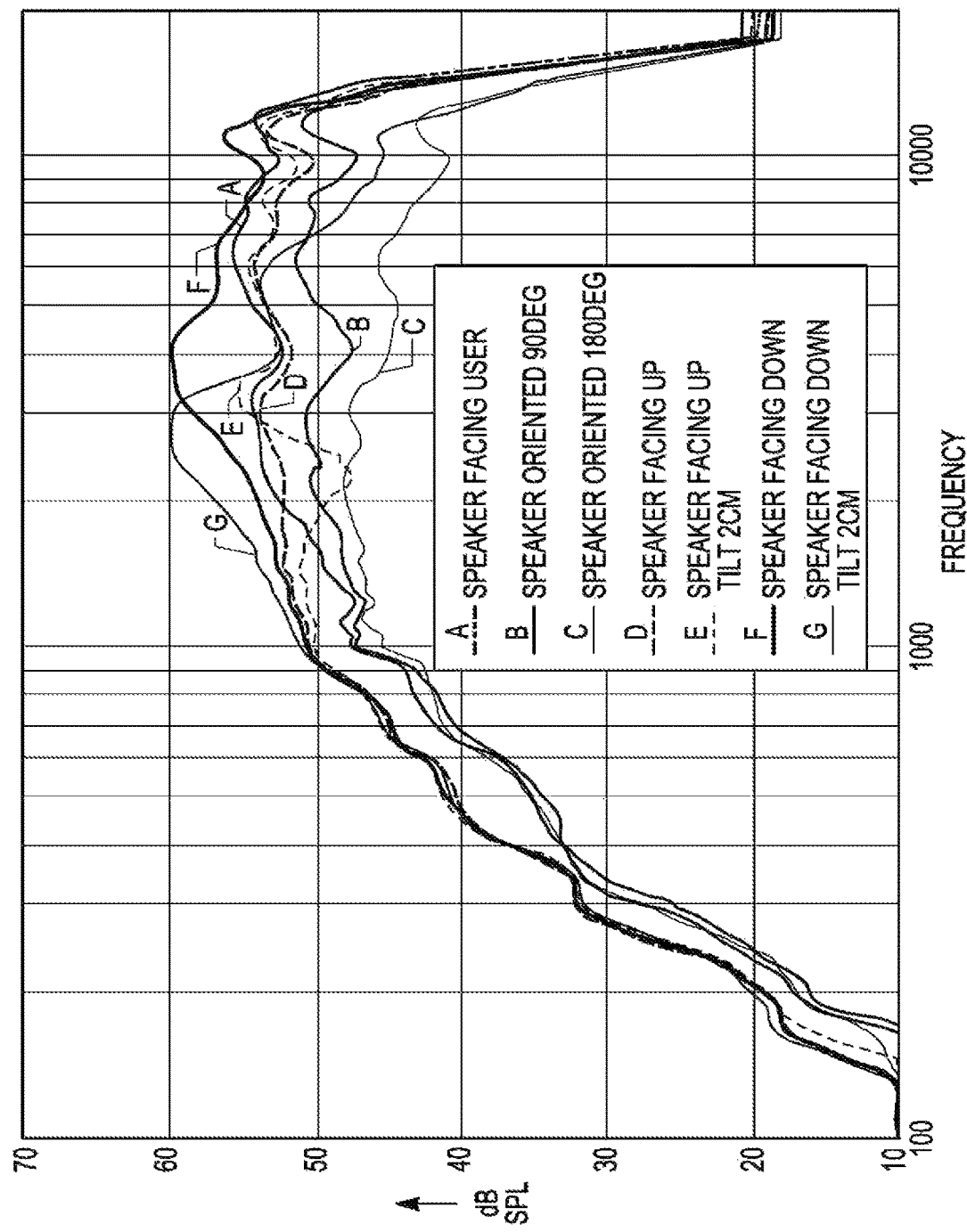

FIGS. 11-13 illustrate example frequency response graphs for audio output from an electronic device in various local positions. In particular, the frequency response graphs correspond to audio that is detected by a microphone positioned at various locations relative to a speaker of the electronic device. According to embodiments, the systems and methods store various equalization settings that may correspond to the frequency response graphs. Further, the systems and methods determine the local position of the electronic device, identify the corresponding equalization setting, and apply the equalization setting to an audio signal so as to more accurately reproduce the audio signal.

FIG. 11 illustrates four (4) example frequency response graphs that correspond to a tabletop local position for an example electronic device. The "D" frequency response graph corresponds to an electronic device located on a table with its speaker face up on the table, the "E" frequency response graph corresponds to the electronic device located on the table with its speaker face up on the table and tilted 2 cm off the table, the "F" frequency response graph corresponds to the electronic device located on the table with its speaker face down on the table, and the "G" frequency response graph corresponds to the electronic device located on the table with its speaker face down on the table and tilted 2 cm off the table. As depicted in FIG. 11, the signal amplitude measured at approximately 2500 Hz is approximately +11 dB (SPL) greater for the "G" frequency response graph than it is for the "E" frequency response graph; however the signal amplitude detected at approximately 10000 Hz is approximately +8 dB (SPL) greater for the "E" frequency response graph than it is for the "G" frequency response graph. The equalization settings corresponding to the "D." "E," "F," and "G" frequency response graphs can be generated accordingly to match the unaltered, measured response curve to a desired response curve.

FIG. 12 illustrates three (3) example frequency response graphs that correspond to a stable local position for an example electronic device. The "A" frequency response graph corresponds to a user holding the electronic device with the speaker facing the user, the "B" frequency response graph corresponds to the user holding the electronic device with the speaker oriented 90 degrees away from the user (i.e., the speaker is perpendicular to the user), and the "C" frequency response graph corresponds to the user holding the electronic device when the speaker oriented 180 degrees from the user (i.e., the speaker is facing away from the user). As depicted in FIG. 12, the signal amplitude detected by the microphone across some of the higher (treble) frequencies is greater for the "A" frequency response graph than it is for the "B" and "C" frequency response graphs. Accordingly, the equalization setting for the "speaker facing user" local position can reduce the treble gain more than the equalization settings for the local positions in which the speaker is oriented away from the user.

FIG. 13 illustrates device response curves corresponding to the "A"-"G" local positions discussed with respect to FIGS. 11 and 12. In particular. FIG. 13 illustrates the sound pressure that is "heard" by a listener when the listener and the device are in the indicated positions. An equalization setting for a corresponding local position may be derived based on a difference between the corresponding response curve and a desired response curve.

Thus, it should be clear from the preceding disclosure that the systems and methods offer improved audio output quality. In particular, the embodiments leverage data from multiple sensors and components to identify appropriate equalization settings for electronic devices to apply to audio signals. Accordingly, the embodiments advantageously enable an improved audio listening experience for users of the electronic devices.

This disclosure is intended to explain how to fashion and use various embodiments in accordance with the technology rather than to limit the true, intended, and fair scope and spirit thereof. The foregoing description is not intended to be exhaustive or to be limited to the precise forms disclosed. Modifications or variations are possible in light of the above teachings. The embodiment(s) were chosen and described to provide the best illustration of the principle of the described technology and its practical application, and to enable one of ordinary skill in the art to utilize the technology in various embodiments and with various modifications as are suited to the particular use contemplated. All such modifications and variations are within the scope of the embodiments as determined by the appended claims, as may be amended during the pendency of this application for patent, and all equivalents thereof, when interpreted in accordance with the breadth to which they are fairly, legally and equitably entitled.

What is claimed is:

1. A method in an electronic device, the method comprising:
    determining, by a processor of the electronic device based on sensor data generated by an accelerometer of the electronic device, that the electronic device is stable and supported by a support surface, wherein the electronic device comprises a first speaker and a second speaker, wherein the second speaker is configured for a music playback operation;
    in response to determining that the electronic device is stable and supported by the support surface, outputting, by the second speaker of the electronic device during the music playback operation, first audio data with a first equalization setting applied thereto, the first equalization setting corresponding to the electronic device being stable and supported by the support surface;
    while outputting the first audio data by the second speaker during the music playback operation, detecting, by a microphone of the electronic device, audio input data;
    modifying, by the processor based on the audio input data, the first equalization setting; and
    outputting, by the second speaker during the music playback operation, second audio data with the first equalization setting that was modified applied thereto.

2. The method of claim 1, further comprising:
    determining, by the processor, a direction in which the second speaker is oriented.

3. The method of claim 1, wherein the audio input data comprises background noise, and wherein modifying the first equalization setting comprises:
    modifying, by the processor, the first equalization setting to account for the background noise.

4. The method of claim 1, wherein modifying the first equalization setting comprises:
    modifying, by the processor based on microphone feedback data present in the audio input data, the first equalization setting.

5. The method of claim 1, wherein modifying the first equalization setting comprises:
modifying, by the processor further based on at least one of optical data, proximity data, or the sensor data from the accelerometer, the first equalization setting.

6. The method of claim 1, wherein the electronic device stores the first equalization setting.

7. An electronic device comprising:
a first speaker;
a second speaker configured for a music playback operation;
a microphone;
an accelerometer;
a memory storing computer-readable instructions; and
at least one processor interfaced with the first speaker, the second speaker, the microphone, the accelerometer, and the memory, and configured to execute the computer-readable instructions to cause the at least one processor to:
determine, based on sensor data generated by the accelerometer, that the electronic device is stable and supported by a support surface,
in response to determining that the electronic device is stable and supported by the support surface, cause the second speaker to output, during the music playback operation, first audio data with a first equalization setting applied thereto, the first equalization setting corresponding to the electronic device being stable and supported by the support surface,
while causing the second speaker to output the first audio data during the music playback operation, access audio input data detected by the microphone,
modify, based on the audio input data, the first equalization setting, and
cause the second speaker to output, during the music playback operation, second audio data with the first equalization setting that was modified applied thereto.

8. The electronic device of claim 7, wherein the at least one processor is further configured to:
determine a direction in which the second speaker is oriented.

9. The electronic device of claim 7, wherein the audio input data comprises background noise, and wherein to modify the first equalization setting, the at least one processor is configured to:
modify the first equalization setting to account for the background noise.

10. The electronic device of claim 7, wherein to modify the first equalization setting, the at least one processor is configured to:
modify, based on microphone feedback data present in the audio input data, the first equalization setting.

11. The electronic device of claim 7, wherein to modify the first equalization setting, the at least one processor is configured to:
modify, further based on at least one of optical data, proximity data, or the sensor data from the accelerometer, the first equalization setting.

12. The electronic device of claim 7, wherein the memory further stores the first equalization setting.

13. A non-transitory computer-readable storage medium storing instructions that, when executed by at least one processor of an electronic device, cause the at least one processor to perform operations comprising:
determining, based on sensor data generated by an accelerometer of the electronic device, that the electronic device is stable and supported by a support surface, wherein the electronic device comprises a first speaker and a second speaker, wherein the second speaker is configured for a music playback operation;
in response to determining that the electronic device is stable and supported by the support surface, outputting, by the second speaker of the electronic device during the music playback operation, first audio data with a first equalization setting applied thereto, the first equalization setting corresponding to the electronic device being stable and supported by the support surface;
while outputting the first audio data by the second weaker during the music playback operation, detecting, by a microphone of the electronic device, audio input data;
modifying, based on the audio input data, the first equalization setting; and
outputting, by the second speaker during the music playback operation, second audio data with the first equalization setting that was modified applied thereto.

14. The non-transitory computer-readable storage medium of claim 13, wherein the at least one processor is configured to perform operations further comprising:
determining a direction in which the second speaker is oriented.

15. The non-transitory computer-readable storage medium of claim 13, wherein the audio input data comprises background noise, and wherein modifying the first equalization setting comprises:
modifying the first equalization setting to account for the background noise.

16. The non-transitory computer-readable storage medium of claim 13, wherein modifying the first equalization setting comprises:
modifying, based on microphone feedback data present in the audio input data, the first equalization setting.

17. The non-transitory computer-readable storage medium of claim 13, wherein modifying the first equalization setting comprises:
modifying, further based on at least one of optical data, proximity data, or the sensor data from the accelerometer, the first equalization setting.

* * * * *